United States Patent [19]

Cranston et al.

[11] Patent Number: 5,065,028

[45] Date of Patent: Nov. 12, 1991

[54] RADIATION DETECTOR

[75] Inventors: Christopher S. Cranston; Neil Cleverly, both of Dorset, England

[73] Assignee: Siemens Plessey Controls Limited, Poole-Dorset, England

[21] Appl. No.: 543,124

[22] Filed: Jun. 25, 1990

[30] Foreign Application Priority Data

Jul. 1, 1989 [GB] United Kingdom ............... 8915173

[51] Int. Cl.$^5$ .............................................. G01T 1/24
[52] U.S. Cl. ............................ 250/370.01; 250/370.14
[58] Field of Search ................... 250/370.01, 370.14, 250/336.1; 357/29

[56] References Cited

U.S. PATENT DOCUMENTS

| | | | |
|---|---|---|---|
| 3,863,072 | 1/1975 | Garin et al. ................... | 250/370.01 |
| 4,785,186 | 11/1988 | Street et al. ................... | 250/370.01 |
| 4,786,810 | 11/1988 | Shulman et al. ................. | 250/328 |
| 4,876,454 | 10/1989 | Burgess .......................... | 250/370.14 |

FOREIGN PATENT DOCUMENTS

| | | | |
|---|---|---|---|
| 0205544 | 12/1983 | Fed. Rep. of Germany ........................ | 250/307.01 |
| 2222660 | 10/1974 | France ........................... | 250/370.01 |

OTHER PUBLICATIONS

Arello et al. "An Energetic Particle Detector for a Synchronos Satellite" IEEE Trans. Nucl. Science vol. NS-22, Feb-1975.

Primary Examiner—Edward P. Westin
Assistant Examiner—Richard Hanig
Attorney, Agent, or Firm—Fleit, Jacobson, Cohn, Price, Holman & Stern

[57] ABSTRACT

A radiation detector for beta radiation, the detector including an enclosure having a membrane surface 7 that allows radiation to pass through it while preventing external light becoming incident upon a photo-detector 1. The photo-detector 1 being arranged to detect ionization radiation and may be formed upon a common substrate 3 with means to amplify detection signals.

6 Claims, 1 Drawing Sheet

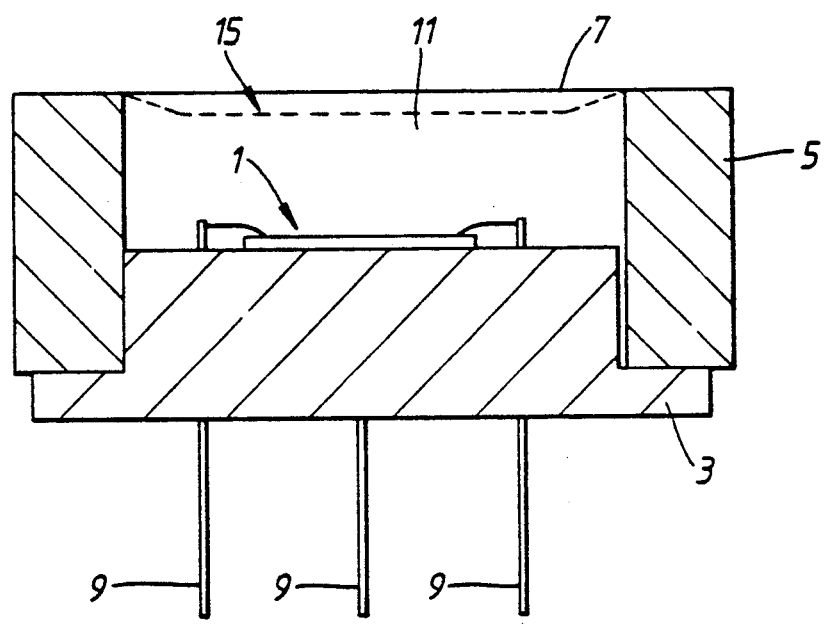

RADIATION DETECTOR

The present invention relates to a radiation detector and more particularly, but not exclusively, to a radiation detector for beta radiation.

It is known to detect beta ionizing radiation using Geiger-Muller tubes.

Geiger-Muller tubes are rather bulky and fragile, furthermore they require a high voltage supply to operate them. These factors limit effective usage of Geiger-Muller tubes in small apparatus and particularly in dosimeters.

The use of photo-diodes is known for detection of ionizing gamma radiation. However a standard photo-diode assembly is not suitable for detecting beta radiation as it will not penetrate the package.

It is an objective of the present invention to provide a radiation detector using a photodiode for detection of beta radiation.

According to the present invention there is provided a radiation detector for beta radiation, the detector including an enclosure having a membrane surface and means to detect ionizing radiation, the membrane surface being arranged to allow radiation to pass through it and in association with the enclosure to isolate from external light the means to detect ionizing radiation.

Preferably, the means to detect ionizing radiation is an infrared photo-diode, the membrane surface may be formed from metal-clad polyimide, polyester or mica or aluminium foil.

The membrane surface may be metallized to allow a good seal between the membrane surface and enclosure through a solder or brazed joint. Furthermore, the membrane surface may be thin enough to allow passage of radiation having an energy of less than 100 keV. A gauze support may be provided for the membrane surface.

The means to detect ionising radiation may be formed upon a common substrate with means to amplify detection signals.

The drawing illustrates a radiation detector according to the present invention.

Referring to the drawing, a photo-diode 1 is mounted in an enclosure formed by a substrate 3 and case 5. The case 5 has a membrane wall surface 7, such as copper-clad polyimide, polyester or mica or aluminium foil. The membrane surface 7 is arranged to allow radiation to pass through whilst providing environmental isolation for the photo-diode particularly preventing light becoming incident upon the photo-diode. The photo-diode 1 is wire bonded to external connections by contacts 9. The enclosure defines a volume 11 which is filled with an inert gas, for example nitrogen, to prevent damage to the photo-diode 1.

In operation, radiation passes through the membrane 7 to stimulate the photo-diode 1 in proportion to radiation intensity. It will be appreciated that the membrane 7 can act as a filter.

Consequently, by suitable choice of mask material and thickness, the radiation detector according to the present invention can be arranged to have a threshold energy level for incident radiation before detection, for example 100 keV.

The membrane surface 7 may be metallized to provide a radio frequency interference (RFI) screen. With the membrane surface 7 metallized with copper there is the advantage that the membrane surface 7 can be secured to the case 5 by solder or brazing. Alternatively, metal loaded epoxy could be used.

A gauze 15 may be added over and/or underneath the membrane surface 7 as a structual support and to reduce microphony i.e. acoustic stimulation of the membrane.

It will be appreciated that the radiation detector can be fabricated in relatively small, robust and electromagnetic interference free embodiments. Furthermore, there is no necessity for a high voltage electrical supply and thus, the present radiation detector is particularly suitable for small battery powered beta radiation dosimeters.

It will be understood that in a favoured embodiment of the present invention, a pulse pre-amplifier could be fabricated upon the same substrate 3 as the photodiode 1, thus improving radio frequency interference (RFI) performance and minimising current drain upon the detector battery.

We claim:

1. A radiation detector for beta radiation, the detector including an enclosure having a membrane surface; means to detect ionizing radiation; and support means for supporting the membrane surface and reducing microphony, wherein the membrane surface is arranged to allow radiation to pass through it and in association with the enclosure to isolate from external light the means to detect ionizing radiation.

2. A detector as claimed in claim 1 wherein the means to detect ionizing radiation is an infra-red photodiode.

3. A detector as claimed in claim 1 wherein the membrane surface is formed from metal-clad polymide, polyester or mica or aluminium foil.

4. A detector as claimed in claim 1 wherein the membrane surface is metallized to reduce radio frequency interference and to allow the membrane surface to be secured to the enclosure by conducting glue, solder or brazed means.

5. A detector as claimed in claim 1 wherein the membrane surface has a thickness determined to allow passage of beta radiation having an energy of less than 100 keV.

6. A detector as claimed in claim 1 wherein the means to detect ionizing radiation and means to amplify detection signals are formed upon a common substrate.

* * * * *